(12) United States Patent
Yagi et al.

(10) Patent No.: US 12,034,017 B2
(45) Date of Patent: Jul. 9, 2024

(54) SENSOR CHIP AND ELECTRONIC DEVICE

(71) Applicant: SONY SEMICONDUCTOR SOLUTIONS CORPORATION, Kanagawa (JP)

(72) Inventors: Shinichiro Yagi, Kanagawa (JP); Yusuke Otake, Kanagawa (JP); Kyosuke Ito, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/134,084

(22) Filed: Apr. 13, 2023

(65) Prior Publication Data

US 2023/0253420 A1  Aug. 10, 2023

Related U.S. Application Data

(63) Continuation of application No. 17/600,674, filed as application No. PCT/JP2020/011368 on Mar. 16, 2020, now Pat. No. 11,670,649.

(30) Foreign Application Priority Data

Apr. 8, 2019  (JP) ................................ 2019-073485

(51) Int. Cl.
*H01L 27/146* (2006.01)
*G01S 7/4863* (2020.01)
(Continued)

(52) U.S. Cl.
CPC ...... *H01L 27/14605* (2013.01); *G01S 7/4863* (2013.01); *G01S 17/894* (2020.01);
(Continued)

(58) Field of Classification Search
CPC ......... H01L 27/14605; H01L 27/14629; H01L 27/1463; H01L 27/14634; H01L 27/14636;
(Continued)

(56) References Cited

U.S. PATENT DOCUMENTS 10,205,033 B1    2/2019  Daly et al.
2015/0340390 A1  11/2015 Wall et al.
(Continued)

FOREIGN PATENT DOCUMENTS

EP  3081963      10/2016
JP  H07-106623   11/1995
(Continued)

OTHER PUBLICATIONS

International Search Report and Written Opinion for International (PCT) Patent Application No. PCT/JP2020/011368, dated Jun. 16, 2020, 7 pages.
(Continued)

*Primary Examiner* — Tony Ko
(74) *Attorney, Agent, or Firm* — Sheridan Ross PC

(57) ABSTRACT

A sensor chip and an electronic device with SPAD pixels each including an avalanche photodiode element. The sensor chip includes a pixel area having an array of pixels, an avalanche photodiode element that amplifies a carrier by a high electric field area provided for the each of the pixels, an inter-pixel separation section that insulates and separates each of the pixels from adjacent pixels, and a wiring in a wiring layer laminated on a surface opposite to a light receiving surface of the semiconductor substrate that covers at least the high electric field area. The pixel array includes a dummy pixel area located near a peripheral edge of the pixel area. A cathode and an anode electric potential of the avalanche photodiode element arranged in the dummy pixel
(Continued)

area are the same, or at least one of the cathode and anode electric potential is in a floating state.

20 Claims, 13 Drawing Sheets

(51) Int. Cl.
    *G01S 17/894*     (2020.01)
    *H04N 25/702*     (2023.01)
    *H04N 25/79*     (2023.01)

(52) U.S. Cl.
    CPC .... *H01L 27/14629* (2013.01); *H01L 27/1463* (2013.01); *H01L 27/14634* (2013.01); *H01L 27/14636* (2013.01); *H01L 27/14665* (2013.01); *H04N 25/702* (2023.01); *H04N 25/79* (2023.01)

(58) Field of Classification Search
    CPC ......... H01L 27/14665; H01L 31/02327; H01L 27/14643; H01L 27/1464; H01L 31/107; H01L 27/14603; G01S 7/4863; G01S 17/894; H04N 25/702; H04N 25/79
See application file for complete search history.

(56) References Cited

U.S. PATENT DOCUMENTS

| | | |
|---|---|---|
| 2017/0229599 A1 | 8/2017 | Sakata |
| 2019/0103504 A1 | 4/2019 | Yamashita |
| 2019/0252442 A1 | 8/2019 | Tanaka et al. |
| 2019/0260949 A1 | 8/2019 | Guerts |
| 2022/0181366 A1 | 6/2022 | Yagi et al. |
| 2023/0117198 A1* | 4/2023 | Ito ..................... H01L 27/14627 257/435 |

FOREIGN PATENT DOCUMENTS

| | | |
|---|---|---|
| JP | 2018-088488 | 6/2018 |
| WO | WO 2018/074530 | 4/2018 |
| WO | WO-2018101033 A1 | 6/2018 |

OTHER PUBLICATIONS

Notice of Allowance for U.S. Appl. No. 17/600,674, dated Jan. 25, 2023, 8 pages.

* cited by examiner

SENSOR CHIP AND ELECTRONIC DEVICE

CROSS REFERENCE TO RELATED APPLICATIONS

This application is a continuation application of U.S. patent application Ser. No. 17/600,674, filed Oct. 1, 2021, which is a national stage application under 35 U.S.C. 371 and claims the benefit of PCT Application No. PCT/JP2020/011368, having an international filing date of 16 Mar. 2020, which designated the United States, which PCT application claimed the benefit of Japanese Patent Application No. 2019-073485, filed 8 Apr. 2019, the entire disclosures of each of which are incorporated herein by reference.

TECHNICAL FIELD

The present disclosure relates to a sensor chip and an electronic device and particularly to a sensor chip and an electronic device that have made it possible to achieve the enhancement of the characteristics of SPAD pixels.

BACKGROUND ART

Nowadays, distance image sensors that each measure distances by means of a ToF (Time-of-Flight) method are attracting attention. In such a distance image sensor, for example, a pixel array in which, by using CMOS (Complementary Metal Oxide Semiconductor) semiconductor integration technology, a plurality of SPAD (Single Photon Avalanche Diode) pixels each including an avalanche photodiode element is formed so as to be arranged on a plane surface can be utilized. In each of the SPAD pixels, in a state in which a significantly larger voltage than a breakdown voltage is applied thereto, upon input of one photon into a high electric-field PN junction area, avalanche amplification occurs. Detecting a period of time during which an electric current has instantaneously flown at the occurrence of the avalanche amplification makes it possible to make a highly accurate distance measurement.

For example, in PTL 1, there is described a sensor chip in which SPAD pixels are arranged in an array in a predetermined pixel area. In the sensor chip in PTL 1, a peripheral area is provided outside an image area, and a pad area is provided outside the peripheral area.

CITATION LIST

Patent Literature

[PTL 1]
International Publication No. WO 2018/074530

SUMMARY

Technical Problem

However, in such a case where the SPAD pixels are arranged in an array in the sensor chip, the periodicity of the SPAD pixels is likely to collapse in an area located near the peripheral edge of the pixel area. In a case where the periodicity of the SPAD pixels has collapsed, there is a possibility that SPAD device characteristics become abnormal and that this causes a bias variation and an electric-current increase that influence the characteristics of the entire sensor chip.

The present disclosure has been made in view of such a problem, and provides a sensor chip and an electronic device for which the enhancement of the characteristics of SPAD pixels each including an avalanche photodiode has been achieved.

Solution to Problem

In order to solve the above problem, a sensor chip according to an aspect of the present disclosure includes a pixel array section including a pixel area in which a plurality of pixels is arranged in rows and columns, an avalanche photodiode element that amplifies a carrier by a high electric field area provided for the each of the pixels, an inter-pixel separation section that insulates and separates the each of the pixels from another pixel adjacent to the each of the pixels in a semiconductor substrate in which the avalanche photodiode element is formed, and a wiring that is arranged in a wiring layer laminated on a surface being opposite to a light receiving surface of the semiconductor substrate in such a way as to cover at least the high electric field area. Further, the pixel array section includes a dummy pixel area located near the peripheral edge of the pixel area, and a cathode electric potential and an anode electric potential of the avalanche photodiode element that is arranged in the dummy pixel area are the same electric potential, or at least one of the cathode electric potential and the anode electric potential is in a floating state.

Further, an electronic device according to another aspect of the presentation disclosure includes a sensor chip including a pixel array section including a pixel area in which a plurality of pixels is arranged in rows and columns, an avalanche photodiode element that amplifies a carrier by a high electric field area provided for the each of the pixels, an inter-pixel separation section that insulates and separates the each of the pixels from another pixel adjacent to the each of the pixels in a semiconductor substrate in which the avalanche photodiode element is formed, and a wiring that is arranged in a wiring layer laminated on a surface being opposite to a light receiving surface of the semiconductor substrate in such a way as to cover at least the high electric field area. Further, the pixel array section includes a dummy pixel area located near the peripheral edge of the pixel area, and a cathode electric potential and an anode electric potential of the avalanche photodiode that is arranged in the dummy pixel area are the same electric potential, or at least one of the cathode electric potential and the anode electric potential is in a floating state.

DESCRIPTION OF EMBODIMENTS

Hereinafter, the present disclosure will be described through embodiments but the following embodiments do not limit inventions set forth in claims of the present description. Further, not all combinations of features that are described in the following embodiments are essential to solution to problem in the present description. Further, the drawings are ones schematically illustrating inventions set forth in claims of the present description, individual portions' sizes, namely, widths, thicknesses, and the like, are different from actual sizes, and ratios among these sizes are also different from actual ratios.

Hereinafter, individual configurations of individual embodiments according to the present disclosure will be described with reference to the drawings.

1. First Embodiment

A sensor chip according to a first embodiment will be described using FIGS. 1 to 4.

Configuration Example of Sensor Chip

Figure 1:
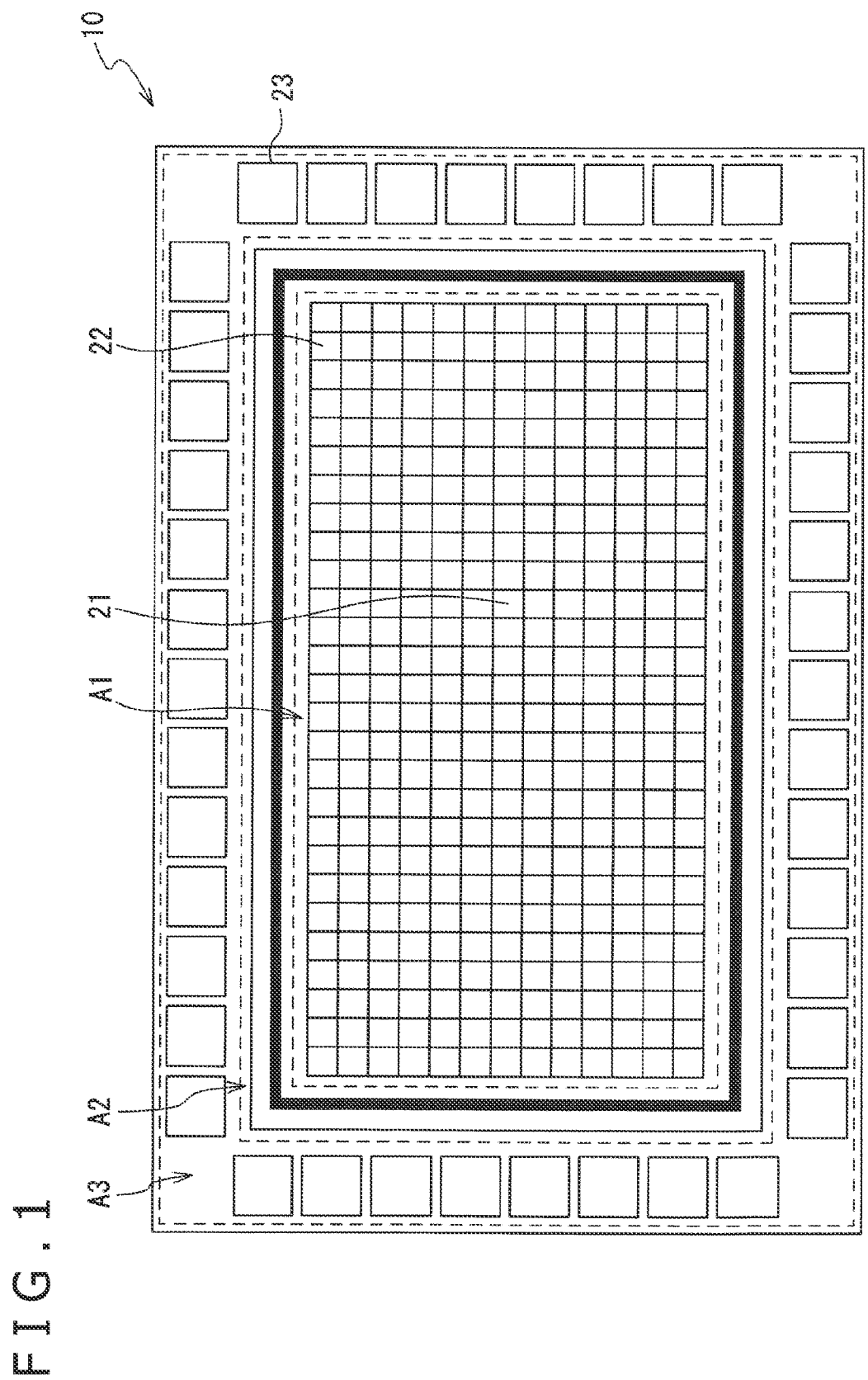
FIG. 1 is a schematic diagram illustrating a configuration of a SPAD pixel formation surface of a sensor chip according to a first embodiment of the present disclosure.

FIG. 1 is a schematic diagram illustrating a configuration of an SPAD pixel formation surface of a sensor chip 10. FIG. 2(A) is a block diagram illustrating a configuration example of the sensor chip 10 to which the present technology is applied. Further, FIG. 2(B) and FIG. 2(C) are respectively a circuit diagram illustrating configurations of each of SPAD pixels 21 and 22 included in the sensor chip 10.

As illustrated in FIG. 1, a pixel array section 11 includes a pixel area A1, a peripheral area A2 provided outside the pixel area A1, and a pad area A3 formed outside the peripheral area A2.

The pixel area A1 is a light receiving surface for receiving light condensed by an unillustrated optical system. In the pixel area A1, the plurality of SPAD pixels 21 and the plurality of SPAD pixels 22 are arranged in rows and columns.

In the pad area A3, a plurality of wiring electrode pads (hereinafter referred to as electrode pads) 23 is formed. The electrode pads 23 are used for, for example, coupling the sensor chip 10 to unillustrated external devices.

The peripheral area A2 is an area between the pixel area A1 and the pad area A3. The peripheral area A2 includes, for example, an n-type semiconductor area and a p-type semiconductor area, and the p-type semiconductor area is coupled to ground (GND).

As illustrated in FIG. 2(A), the sensor chip 10 includes a bias voltage application section 12 together with the pixel array section 11.

The bias voltage application section 12 applies a bias voltage to each of the plurality of SPAD pixels 21 arranged in the pixel array section 11.

The pixel area A1 of the pixel array section 11 includes a reference pixel area RA located at the center of the pixel area A1, and a dummy pixel area DA located near the peripheral edge of the pixel area A1 and enclosing the reference pixel area RA.

The SPAD pixels 21 are pixels arranged in the reference pixel area RA. Such a SPAD pixel 21 is an effective SPAD pixel (hereinafter referred to as a reference pixel) that outputs a received light signal (APD OUT) that is an arisen pulse waveshape with its start point corresponding to an arrival time point of one photon. Note that FIG. 2(A) illustrates a condition in which 24 SPAD pixels 21 are arrayed in a matrix of six vertical-direction pixels×eight horizontal-direction pixels, but this array is just an example and does not limit any appropriate array.

On the other hand, the SPAD pixels 22 are pixels arranged in the dummy pixel area DA. The dummy pixel area DA is located near the peripheral edge of the pixel array section 11, and is an area for which a process at the time of forming the SPAD pixels 22 is likely to be unstable. For the SPAD pixels 22 having been formed in the dummy pixel area DA, the shape collapse and the arrangement periodicity collapse are likely to arise. For this reason, such a SPAD pixel 22 is caused to be an ineffective SPAD pixel (hereinafter referred to as a dummy pixel) that does not function as a general SPAD pixel, that is, that does not output the above-described received light signal (APD OUT). Note that FIG. 2(A) illustrates a condition in which 60 SPAD pixels 22 are arrayed so as to line in the dummy pixel area DA, but this array is just an example and does not limit any appropriate array. In an actual sensor chip 10, the configuration is made such that the number of the SPAD pixels 22 arrayed in the dummy pixel area DA is sufficiently smaller than the number of the SPAD pixels 21 arrayed in the reference pixel area RA.

The shape collapses and the arrangement periodicity collapses of the SPAD pixels 22 arise due to the arrangements of the peripheral area A2 and the pad area A3 in a portion near the pixel area A1 in which the SPAD pixels 21 and 22 are arranged in rows and columns. When the SPAD pixels 21 and 22 are formed, in order to implant impurity ions into a SPAD pixel formation area, a resist film having an opening is formed on the pixel area A1. A resist film having been formed on the peripheral area A2 and the pad area A3 does not include an opening corresponding to the formation position of the SPAD pixels 21 and 22, and thus has a larger resist material amount than the resist film having been formed on the pixel area A1. For this reason, for the resist film having been formed on the peripheral area A2 and the pad area A3, a deformation is likely to arise due to its weight. Because of this deformation of the resist film that functions as a mask at the time of implanting the impurity ions, a process defect is likely to arise. That is, a process defect is likely to arise in an opening portion having been formed in a portion slightly further inside than the peripheral area A2 and the pad area A3 (namely, in a portion near the peripheral edge of the pixel area A1). For this reason, for the SPAD pixels 22 having been formed in the dummy pixel area DA, the shape collapses and the arrangement periodicity collapses are likely to arise.

Thus, the sensor chip 10 having been configured to cause the SPAD pixels 22 formed in an area located near the peripheral edge of the pixel area A1 to be the dummy pixels and thereby use only the outputs of the SPAD pixels 21 formed in the center area of the pixel area A1 is capable of obtaining good characteristics.

Hereinafter, the SPAD pixel 21 which is the reference pixel and the SPAD pixel 22 which is the dummy pixel will be described in detail.

(Circuit Configuration of Reference Pixel)

As illustrated in FIG. 2(B), the SPAD pixel 21 which is the reference pixel includes a SPAD element 31, a p-type MOSFET (Metal-Oxide-Semiconductor Field-Effect Transistor) 32, and an inverter 33.

For the SPAD element 31, its anode is coupled to the bias voltage application section 12, and its cathode is coupled to the source terminal of a quenching resistance 32, which will be described later. The anode of the SPAD element 31 is supplied with a bias voltage VB from the bias voltage application section 12. The SPAD element 31 is an avalanche photodiode element that forms an avalanche multiplying area by being supplied, to its cathode, with a large negative voltage and that is capable of avalanche-multiplying electrons that are generated by the incidence of one photon.

The quenching resistance 32 is coupled to the SPAD element 31 in series, the source terminal of the quenching resistance 32 is coupled to the cathode of the SPAD element 31, and the drain terminal thereof is coupled to an unillustrated power supply. The quenching resistance 32 can be configured by a transistor or a resistor, and, for example, a p-type MOSFET can be used. The drain terminal of the quenching resistance 32 is supplied with an excitation voltage VE from a power supply. When a voltage generated by the electrons having been avalanche-multiplied in the SPAD element 31 has reached a negative voltage VBD, the quenching resistance 32 performs quenching for returning the voltage to an initial voltage. When a cathode voltage of the SPAD element 31 has reached the negative voltage VBD, the quenching resistance 32 performs the quenching by emitting the electrons having been multiplied in the SPAD element 31.

The input terminal of the inverter 33 is coupled to the cathode of the SPAD element 31 and the source terminal of the quenching resistance 32, and the output terminal thereof is coupled to an unillustrated arithmetic processing section provided at a subsequent stage. The inverter 33 is, for example, a CMOS invertor. The inverter 33 outputs the received light signal on the basis of the electrons having been multiplied in the SPAD element 31. More specifically, the inverter 33 shapes the voltage generated by the electrons having been multiplied in the SPAD element 31. Further, the inverter 33 outputs, to the arithmetic processing section, the received light signal (APD OUT) that is an arisen pulse waveshape, such as one illustrated in FIG. 2(B), its start point corresponding to an arrival time point of one photon.

(Circuit Configuration of Dummy Pixel)

As illustrated in FIG. 2(C), the SPAD pixel 22 which is the dummy pixel includes, just like the SPAD pixel 21, the SPAD element 31, the p-type MOSFET (Metal-Oxide-Semiconductor Field-Effect Transistor) 32, and the inverter 33. The SPAD pixel 22 is different from the SPAD pixel 21 in that wirings are different.

The anode of the SPAD element 31 is coupled to the bias voltage application section 12, whereas the cathode of the SPAD element 31 is not coupled to the source terminal of the quenching resistance 32 and is in a floating state. That is, the cathode electric potential of the SPAD element 31 of each of the SPAD pixels 22 that are formed in the dummy pixel area DA included in the pixel area A1 and located near the peripheral edge of the pixel area A1 is caused to be in a floating state. For this reason, the cathode of the SPAD element 31 is not supplied with the large negative voltage and is in a substantially non-functional state.

Specifically, the above configuration makes it possible to prevent the occurrence of a phenomenon in which breakdowns continuously occur in the SPAD elements 31 of the SPAD pixels 22 and this causes a bias variation and an electric-current increase that influence external devices coupled to the sensor chip 10. The above configuration makes it possible to, in the sensor chip 10, suppress the increase of the power consumption of the sensor chip 10 due to the flows of large electric currents in the SPAD elements 31 of the SPAD pixels 22. Further, the above configuration makes it possible to, in the sensor chip 10, suppress the degradation of sensing accuracy due to the drops of anode electric potentials of the SPAD pixels 21 which are caused by the flows of the large electric currents in the SPAD elements 31.

The source terminal of the quenching resistance 32 is not coupled to the cathode of the SPAD element 31 and is in a floating state. For this reason, the quenching resistance 32 is configured not to perform quenching.

The input terminal of the inverter 33 is not coupled to the cathode of the SPAD element 31 and the source terminal of the quenching resistance 32 and is in a floating state. For this reason, the inverter 33 is configured not to output the received light signal (APD OUT).

In the sensor chip 10, as illustrated in an example of FIG. 2(A), among the SPAD pixels 21 and the SPAD pixels 22 arranged in rows and columns, the anodes of a plurality of SPAD pixels 21 arranged in each of row directions and the anodes of a plurality of SPAD pixels 22 arranged in the each of row directions are coupled to each other by a corresponding common wiring.

From the sensor chip 10 configured in such a way as described above, the received light signal is output for each of the SPAD pixels 21 and is supplied to the arithmetic processing section provided at the subsequent stage. For example, the arithmetic processing section calculates, for each of the SPAD pixels 21, a distance up to an object by performing, for each of the received light signals from the SPAD pixels 21, arithmetic processing for calculating a distance on the basis of a timing at which a pulse has arisen and which indicates an arrival time point of one photon. Further, on the basis of calculated distances, a distance image is generated in which distances up to the object, which have been detected by the plurality of SPAD pixels 21, are arranged on a plane surface.

At this time, since the received light signals are not output from the SPAD pixels 22, the SPAD pixels 22 do not contribute to the generation of the above distance image.

(Structure of Reference Pixel)

Figure 2:
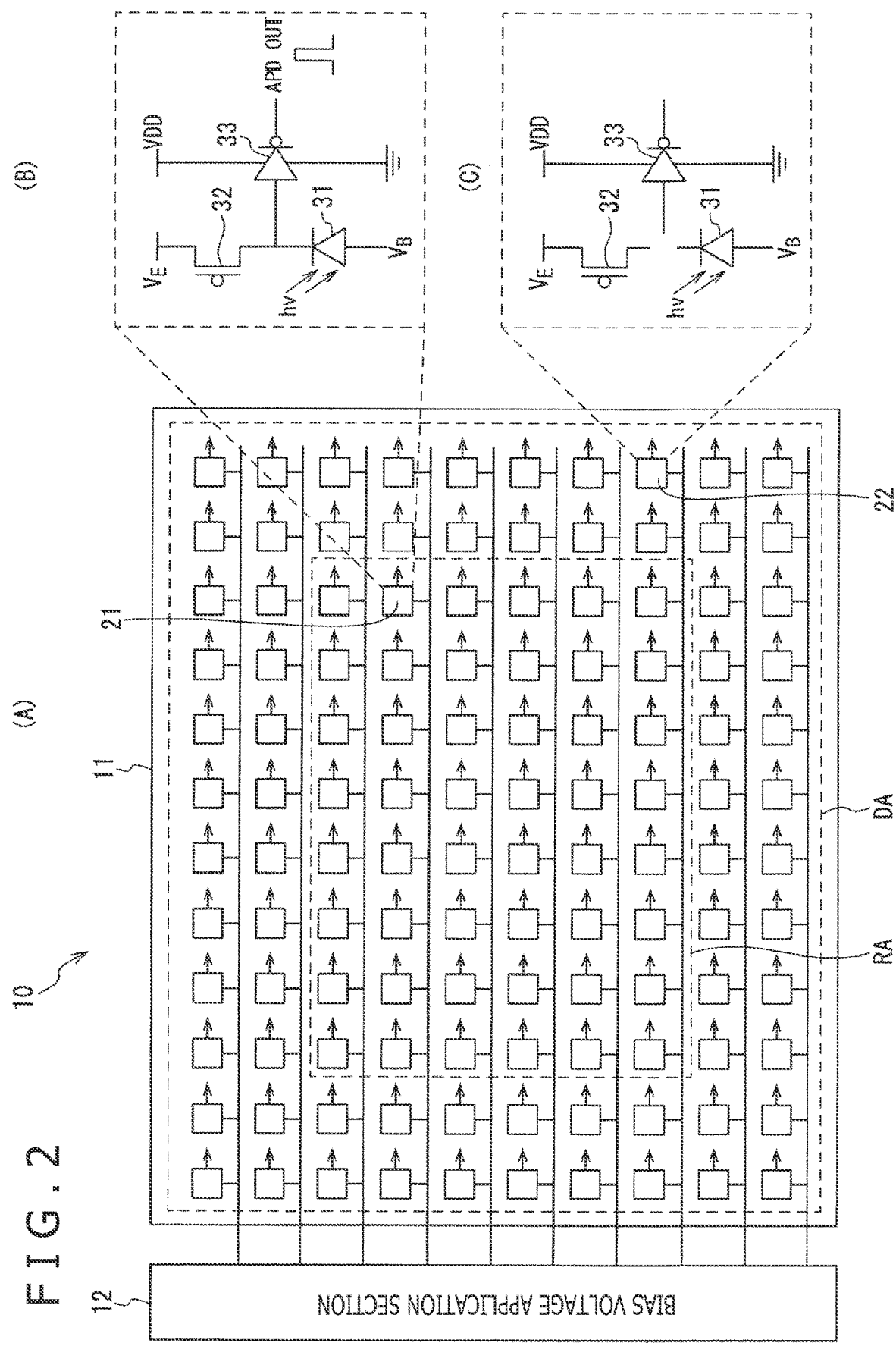
FIG. 2 is a block diagram illustrating a configuration example of the sensor chip according to the first embodiment of the present disclosure.
Figure 3:
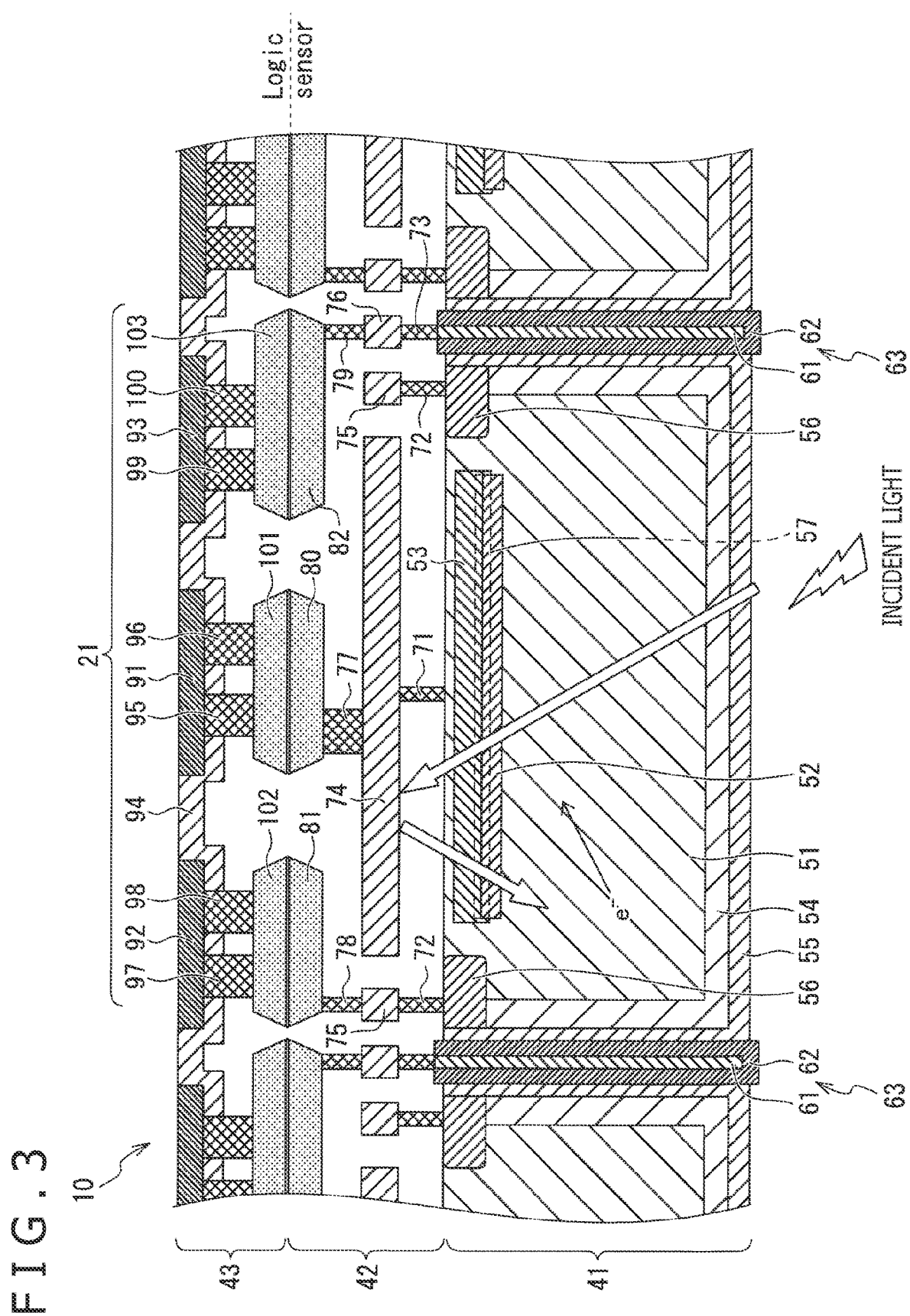
FIG. 3 is a cross-sectional view of a SPAD pixel of the sensor chip according to the first embodiment of the present disclosure illustrating a configuration example of the SPAD pixel.

A configuration example of the SPAD pixel 21 which is the reference pixel formed in the sensor chip 10 will be described using FIGS. 2(B) and 3. FIG. 3 is a cross-sectional view of the SPAD pixel 21 illustrating a configuration example of the SPAD pixel 21.

As illustrated in FIG. 3, the reference pixel area RA of the sensor chip 10 has a laminated layer structure in which a sensor substrate 41, a sensor-side wiring layer 42, and a logic-side wiring layer 43 are laminated, and an unillustrated logic circuit substrate is laminated on the logic-side wiring layer 43.

In the logic circuit substrate, for example, the bias voltage application section 12 illustrated in FIG. 2(A), a plurality of the quenching resistances 32, a plurality of the inverters 33, and the like are formed. The sensor substrate 41 and the logic circuit substrate are electrically coupled to each other by the sensor-side wiring layer 42 and the logic-side wiring layer 43 that function as wiring layers. For example, the sensor chip 10 can be produced by a production method in which, after the sensor-side wiring layer 42 has been arranged so as to face the sensor substrate 41 and the logic-side wiring layer 43 has been arranged so as to face the logic circuit substrate, the sensor-side wiring layer 42 and the logic-side wiring layer 43 are joined at a joint surface (a surface represented by a dashed line in FIG. 3).

The sensor substrate 41 is a semiconductor substrate obtained by thinly slicing, for example, single-crystal silicon. In the sensor substrate 41, the concentration of p-type or n-type impurities is controlled, and the SPAD element 31 is formed for each of the SPAD pixels 21. Further, a downwardly facing surface of the sensor substrate 41 in FIG. 3 is configured as a light receiving surface for receiving light, and the sensor-side wiring layer 42 is laminated on a surface opposite the light receiving surface (namely, on an upwardly facing surface of the sensor substrate 41 in FIG. 2).

In the sensor-side wiring layer 42 and the logic-side wiring layer 43, wirings for supplying an applied voltage from the bias voltage application section 12 to the SPAD elements 31, wirings for bringing out, from the sensor substrate 41, the electrons having been generated in the SPAD elements 31, and any other kind of wirings are formed.

The SPAD element 31 includes an N-well 51, a P-type diffusion layer 52, an N-type diffusion layer 53, a hole accumulation layer 54, a pinning layer 55, and a high-concentration P-type diffusion layer 56, which are formed in the sensor substrate 41. Further, in the SPAD element 31, an avalanche multiplying area 57 is formed by a depletion layer formed in an area to which the P-type diffusion layer 52 and the N-type diffusion layer 53 are coupled.

The N-well 51 is formed by controlling the impurity concentration of the sensor substrate 41 to an n-type one, and forms an electric field that transfers, to the avalanche multiplying area 57, electrons generated by a photoelectric conversion in the SPAD element 31. Here, a P-well may be formed instead of the N-well 51 by controlling the impurity concentration of the sensor substrate 41 to a p-type one.

The P-type diffusion layer 52 is a thick P-type diffusion layer (P+) that is formed near the surface of the sensor substrate 41 and on the back surface side (side downward in FIG. 3) relative to the N-type diffusion layer 53, and is formed across mostly the entire surface of the SPAD element 31.

The N-type diffusion layer 53 is a thick N-type diffusion layer (N+) that is formed near the surface of the sensor substrate 41 and on the front surface side (side upward in FIG. 3) relative to the P-type diffusion layer 52, and is formed across mostly the entire surface of the SPAD element 31. Further, in order to be coupled to a contact electrode 71 for supplying a negative voltage for use in forming the avalanche multiplying area 57, the N-type diffusion layer 53 is configured such that its partial portion has a projection shape that is formed so as to reach the surface of the sensor substrate 41.

The hole accumulation layer 54 is a P-type diffusion layer (P) that is formed so as to surround the side surfaces and the bottom surface of the N-well 51, and accumulates holes. Further, the hole accumulation layer 54 is electrically coupled to the anode of the SPAD element 31 to enable a bias adjustment. This configuration enhances the hole concentration of the hole accumulation layer 54 and strengthens pinning including the pinning layer 55, thereby enabling suppression of, for example, the occurrence of a dark electric current.

The pinning layer 55 is a thick P-type diffusion layer (P+) that is formed on a surface further outside than the hole accumulation layer 54 (namely, on the back surface of the sensor substrate 41 and side surfaces in contact with insulating films 62), and suppresses, for example, the occurrence of the dark electric current, like the hole accumulation layer 54.

The high-concentration P-type diffusion layer 56 is a thick P-type diffusion layer (P++) that is formed near the surface of the sensor substrate 41 so as to surround the peripheral edge of the N-well 51, and is used for coupling to a contact electrode 72 for use in electrically coupling the hole accumulation layer 54 to the anode of the SPAD element 31.

The avalanche multiplying area 57 is a high electric field area that a large negative voltage applied to the N-type diffusion layer 53 forms on a boundary surface between the P-type diffusion layer 52 and the N-type diffusion layer 53, and multiplies electrons (e−) generated by one incident photon into the SPAD element 31.

The sensor chip 10 includes inter-pixel separation sections 63 each formed between SPAD elements 31 adjacent to each other. Such an inter-pixel separation section 63 is formed in a double structure of a metal film 61 and an insulating film 62. The inter-pixel separation section 63 is formed so as to penetrate, for example, from the back surface to the front surface of the sensor substrate 41. The SPAD element 31 is electrically and optically separated from adjacent SPAD elements 31 by the inter-pixel separation sections 63.

The metal film 61 is a film including metal that reflects light (for example, tungsten or the like).

The insulating film 62 is a film having insulation and including SiO2 or the like.

The inter-pixel separation section 63 is formed, for example, by being embedded into the sensor substrate 41 in a state in which the surface of the metal film 61 is covered by the insulating film 62.

In the sensor-side wiring layer 42, contact electrodes 71 to 73, metal wirings 74 to 76, contact electrodes 77 to 79, and metal pads 80 to 82 are formed.

The contact electrode 71 couples the N-type diffusion layer 53 to the metal wiring 74. The contact electrode 72 couples the high-concentration P-type diffusion layer 56 to the metal wiring 75. The contact electrode 73 couples the metal film 61 to the metal wiring 76.

The metal wiring 74 is, for example, as illustrated in FIG. 3, more widely formed than the avalanche multiplying area 57 so as to cover at least the avalanche multiplying area 57. Further, as indicated by white arrows in FIG. 3, the metal wiring 74 reflects light having transmitted through the SPAD element 31 toward the SPAD element 31.

The metal wiring 75 is, for example, as illustrated in FIG. 3, formed so as to surround the peripheral edge of the metal wiring 74 and overlap with the high-concentration P-type diffusion layer 56. The metal wiring 76 is formed so as to be coupled to the metal film 61 at, for example, each of the four corners of the SPAD pixel 21.

The contact electrode 77 couples the metal wiring 74 to the metal pad 80. The contact electrode 78 couples the metal wiring 75 to the metal pad 81. The contact electrode 79 couples the metal wiring 76 to the metal pad 82.

The metal pads 80 to 82 are used to electrically and mechanically join metal pads 101 to 103 formed in the logic-side wiring layer 43 to the respective metal pads 80 to 82 themselves through metals (Cu) that form individual pairs of metal pads to be joined to each other.

In the logic-side wiring layer 43, electrode pads 91 to 93, an insulating layer 94, contact electrodes 95 to 100, and the metal pads 101 to 103 are formed.

The electrode pads 91 to 93 are each coupled to a corresponding unillustrated logic circuit substrate, and the insulating layer 94 insulates the electrode pads 91 to 93 from one another.

The contact electrode 95 and 96 couple the electrode pad 91 to the metal pad 101, the contact electrodes 97 and 98 couple the electrode pad 92 to the metal pad 102, and the contact electrodes 99 and 100 couple the electrode pad 93 to the metal pad 103.

The metal pad 101 is joined to the metal pad 80, the metal pad 102 is joined to the metal pad 81, and the metal pad 103 is joined to the metal pad 82.

Such a wiring structure as described above allows, for example, the electrode pad 91 to be coupled to the N-type diffusion layer 53 via the contact electrodes 95 and 96, the metal pad 101, the metal pad 80, the contact electrode 77, the metal wiring 74, and the contact electrode 71. In the SPAD pixel 21, therefore, a large negative voltage to be applied to the N-type diffusion layer 53 can be supplied from the logic circuit substrate to the electrode pad 91.

Further, the electrode pad 92 is coupled to the high-concentration P-type diffusion layer 56 via the contact electrodes 97 and 98, the metal pad 102, the metal pad 81, the contact electrode 78, the metal wiring 75, and the contact electrode 72. In the SPAD pixel 21, therefore, the anode of the SPAD element 31 which is to be electrically coupled to the hole accumulation layer 54 is coupled to the electrode pad 92 and this configuration enables a bias adjustment for the hole accumulation layer 54 via the electrode pad 92.

Moreover, the coupling configuration is also made such that the electrode pad 93 is coupled to the metal film 61 via the contact electrodes 99 and 100, the metal pad 103, the metal pad 82, the contact electrode 79, the metal wiring 76, and the contact electrode 73. In the SPAD pixel 21, therefore, a bias voltage to be supplied from the logic circuit substrate to the electrode pad 93 can be applied to the metal film 61.

Further, in the SPAD pixel 21, as described above, the metal wiring 74 is more widely formed than the avalanche multiplying area 57 so as to cover at least the avalanche multiplying area 57, and the metal film 61 is formed so as to penetrate the sensor substrate 41. That is, the SPAD pixel 21 is formed so as to establish a reflection structure in which all structures of the SPAD element 31 other than the light incident surface is enclosed by the metal wiring 74 and the metal films 61. This configuration enables the SPAD pixel 21 to, by the effect of the light reflection by the metal wiring 74 and the metal films 61, prevent the occurrence of optical crosstalk and enhance the sensitivity of the SPAD element 31.

Further, the SPAD pixel 21 enables the bias adjustment by the coupling structure in which the side faces and the bottom surface of the N-well 51 are surrounded by the hole accumulation layer 54 and the hole accumulation layer 54 is electrically coupled to the anode of the SPAD element 31. Moreover, the SPAD pixel 21 is capable of forming an electric field that assists carriers to the avalanche multiplying area 57 by applying a bias voltage to the metal films 61 of the inter-pixel separation section 63.

(Configuration of Dummy Pixel)

Figure 4:
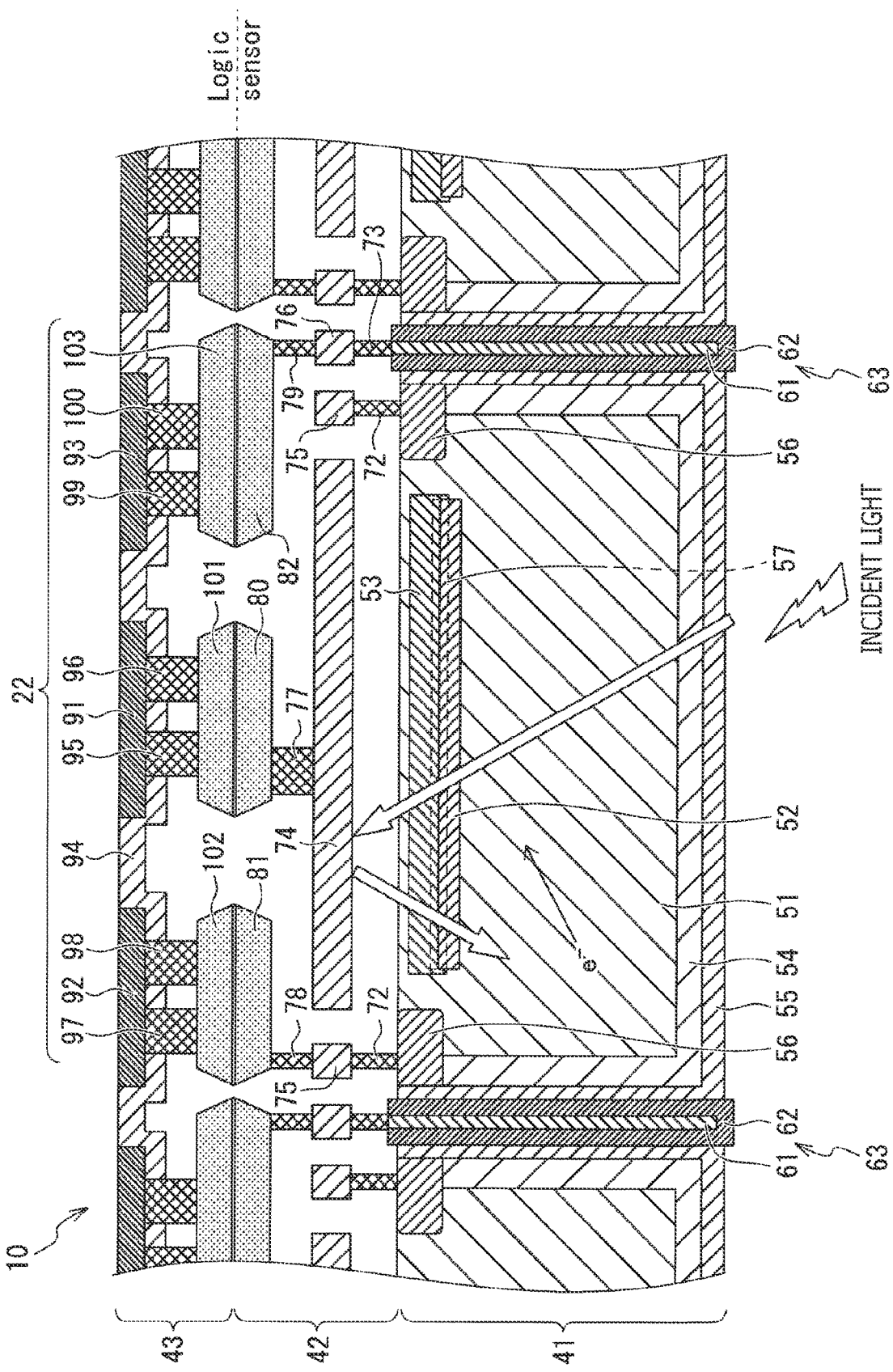
FIG. 4 is a cross-sectional view of a SPAD pixel of the sensor chip according to the first embodiment of the present disclosure illustrating a configuration example of the SPAD pixel.

A configuration example of the SPAD pixel 22 which is the dummy pixel formed in the sensor chip 10 will be described using FIGS. 2(C) and 4. FIG. 4 is a cross-sectional view of the SPAD pixel 22 illustrating a configuration example of the SPAD pixel 22.

As illustrated in FIG. 4, the dummy pixel area DA has, just like the reference pixel area RA, a laminated layer structure in which the sensor substrate 41, the sensor-side wiring layer 42, and the logic-side wiring layer 43 are laminated.

The SPAD pixel 22 includes, just like the SPAD pixel 21, the SPAD element 31, the quenching resistance 32, and the inverter 33.

Further, in the sensor-side wiring layer 42, the contact electrodes 72 and 73, the metal wirings 74 to 76, the contact electrodes 77 to 79, and the metal pads 80 to 82 are formed.

Moreover, in the logic-side wiring layer 43, the electrode pads 91 to 93, the insulating layer 94, the contact electrodes 95 to 100, and the metal pads 101 to 103 are formed.

As illustrated in FIG. 2(C), the SPAD pixel 22 is different from the SPAD pixel 21 in that the cathode of the SPAD element 31 is not coupled to the source terminal of the quenching resistance 32 and is in a floating state.

As illustrated in FIG. 4, the SPAD pixel 22 is different from the SPAD pixel 21 in that, in order to cause the cathode electric potential of the SPAD element 31 to be in a floating state, the contact electrode 71 is not provided and the SPAD element 31 is not electrically coupled to the metal wiring 74. The other configurations are similar to those of the SPAD pixel 21.

The SPAD element which is the avalanche photodiode has recently been used as an image sensor, and its characteristics superior to its conventional ones have been required. For the avalanche photodiode, its size is larger than that of a general photodiode. For this reason, when the avalanche photodiode which is the SPAD pixel is formed, a usage amount of a resist material is large, and thus, the shape of a mask having been formed with the resist material is likely to be distorted. Thus, using the configuration of the sensor chip according to the present disclosure to cause the SPAD pixels formed in a portion located near the peripheral edge of the pixel array section, in which a formation abnormality is highly likely to occur, to be ineffective pixels further increases the effect of the enhancement of the characteristics of the sensor chip 10.

Effects of First Embodiment

The sensor chip 10 according to the first embodiment and having been configured in such a way as described above brings about the following effects.

(1) The sensor chip 10 is configured to cause the SPAD pixels 22 for which the shape collapses and the arrangement periodicity collapses are likely to arise not to output the received light signals (APD OUT). Thus, the sensor chip 10 is capable of causing only received light signals from the highly stable SPAD pixels 21 to be output. This configuration makes it possible to calculate distances up to an object on the basis of only the received light signals from the highly stable SPAD pixels 21 and thereby generate a highly accurate distance image.

(2) The sensor chip 10 is configured to enable suppression of the occurrences of large electric currents in the SPAD pixels 22. This configuration enables suppression of the increase of the power consumption of the entire sensor chip 10 due to the flows of the large electric currents in the SPAD pixels 22.

(3) The sensor chip 10 is configured to enable suppression of the occurrences of large electric currents in the SPAD pixels 22. This configuration enables suppression of the degradation of sensing accuracy due to the drops of anode electric potentials of the SPAD pixels 21, which are caused by the flows of the large electric currents in the SPAD pixels 22.

(4) The sensor chip 10 is configured to enable suppression of the occurrences of large electric currents in the SPAD pixels 22. This configuration suppresses the occurrences of crosstalk among the SPAD pixels 21 of the reference pixel area RA due to the occurrences of the large electric currents in the SPAD pixels 22, and thus enhances the sensitivities of the SPAD elements 31 of the SPAD pixels 21.

2. Second Embodiment

A sensor chip according the second embodiment will be described referring to FIGS. 2 to 4 and using FIG. 5. A sensor chip 10A according to the second embodiment is different from the sensor chip 10 according to the first embodiment in that the sensor chip 10A includes, as the dummy pixels, SPAD pixels 22A instead of the SPAD pixels 22.

Individual portions other than portions related to this difference in such a SPAD pixel 22B are formed in a way similar to that for the SPAD pixel 22 of the sensor chip 10 according to the first embodiment.
(Circuit Configuration of Dummy Pixel)
In the following, differences between the SPAD pixel 22B and the SPAD pixel 21 will be described.

The anode of the SPAD element 31 of the SPAD pixel 22 which is the dummy pixel is not coupled to the bias voltage application section 12 and is in a floating state. Further, the cathode of the SPAD element 31 is not coupled to the source terminal of the quenching resistance 32 and is in a floating state. That is, the cathode electric potential and the anode electric potential of the SPAD element 31 of each of the SPAD pixels 22B that are formed in the dummy pixel area DA included in the pixel area A1 and located near the peripheral edge of the pixel area A1 are each in a floating state. Thus, the SPAD element 31 is not supplied, to its cathode, with the large negative voltage, and is in a substantially non-functional state.
(Configuration of Dummy Pixel)
A configuration example of the SPAD pixel 22A which is the dummy pixel of the sensor chip 10A will be described using FIG. 5. FIG. 4 is a cross-sectional view of the SPAD pixel 22A illustrating a configuration example of the SPAD pixel 22A.

The SPAD pixel 22A includes, just like the SPAD pixels 21 and 22, the SPAD element 31, the quenching resistance 32, and the inverter 33.

Further, in the sensor-side wiring layer 42, the contact electrode 73, the metal wirings 74 to 76, the contact electrodes 77 to 79, and the metal pads 80 to 82 are formed.

The configuration of the logic-side wiring layer 43 is similar to that of the SPAD pixel 22.

Figure 5:
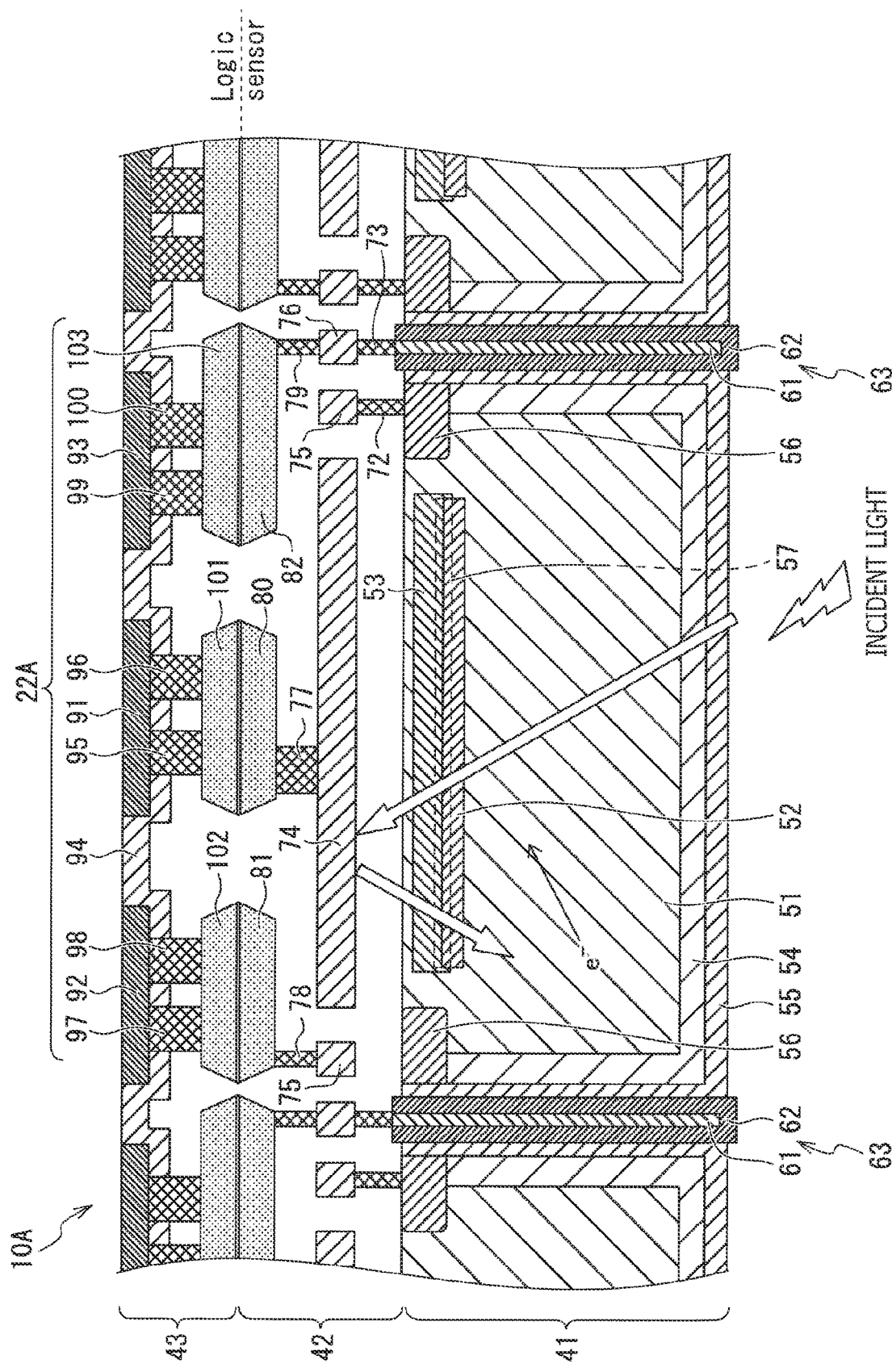
FIG. 5 is a cross-sectional view of a SPAD pixel of a sensor chip according to a second embodiment of the present disclosure illustrating a configuration example of the SPAD pixel.

As illustrated in FIG. 5, in the SPAD pixel 22A, in order to cause the cathode electric potential of the SPAD element 31 to be in a floating state, any contact electrode for coupling the SPAD element 31 to the metal wiring 74 is not provided. Further, in the SPAD pixel 22A, in order to cause the anode electric potential of the SPAD element 31 to be in a floating state, any contact electrode for coupling the SPAD element 31 to the metal wiring 75 is not provided.

Effects of Second Embodiment

The sensor chip 10A according to the second embodiment and having been configured in such a way as described above brings about effects similar to (1) to (4) in the first embodiment.

Modification Example

In the sensor chip, in order to cause the SPAD pixels having been formed in the dummy pixel area DA to be the dummy pixels, it is sufficient just to cause at least one of the cathode electric potential and the anode electric potential to be in a floating state.

In the first embodiment and the second embodiment, respectively, the sensor chip 10 in which the cathode electric potential of each of the SPAD pixels 22 formed in the dummy pixel area DA is caused to be in a floating state and the sensor chip 10A in which the cathode electric potential and the anode electric potential are each caused to be in a floating state have been described, but the present disclosure is not limited to the above configurations.

That is, for SPAD pixels of a sensor chip, a configuration may be employed in which the cathode electric potential of each of the SPAD elements 31 is caused to be in a floating state. In this case, such a SPAD pixel has a configuration in which, in the SPAD pixel 21 illustrated in FIG. 2, the contact electrode 71 is provided and the contact electrode 72 is not provided.

3. Third Embodiment

A sensor chip according the third embodiment will be described referring to FIGS. 2 to 4 and using FIGS. 6 and 7. A sensor chip 10B according to the third embodiment is different from the sensor chip 10 according to the first embodiment in that the sensor chip 10B includes, as the dummy pixels, SPAD pixels 22B instead of the SPAD pixels 22. Further, the SPAD pixels 21 which are the reference pixels are formed in a way similar to that for the SPAD pixels 21 of the sensor chip 10 according to the first embodiment.
(Circuit Configuration of Dummy Pixel)
In the following, differences between the SPAD pixel 22B and the SPAD pixel 21 will be described.

Figure 6:
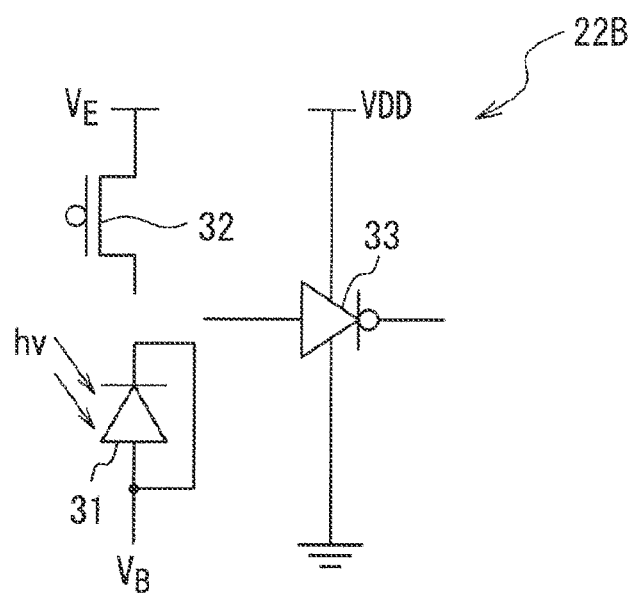
FIG. 6 is a circuit diagram illustrating a configuration example of a sensor chip according to a third embodiment of the present disclosure.

As illustrated in FIG. 6, the anode of the SPAD element 31 of the SPAD pixel 22B which is the dummy pixel is coupled to the bias voltage application section 12, but the cathode of the SPAD element 31 is not coupled to the source terminal of the quenching resistance 32. Further, the cathode and the anode of the SPAD element 31 are short-circuited. That is, the cathode electric potential and the anode electric potential of each of the SPAD elements 31 that are formed in the dummy pixel area DA located near the peripheral edge of the pixel area A1 are caused to be the same electric potential. Thus, the SPAD element 31 is not supplied, to its cathode, with the large negative voltage, and is in a substantially non-functional state.

Individual portions other than the above portions in the SPAD pixel 22B are formed in a way similar to that for the SPAD pixel 22 of the sensor chip 10 according to the first embodiment.

(Configuration of Dummy Pixel)

A configuration example of the SPAD pixel 22B which is the dummy pixel of the sensor chip 10B will be described using FIG. 7. FIG. 7 is a cross-sectional view of the SPAD pixel 22B illustrating a configuration example of the SPAD pixel 22B.

The SPAD pixel 22B includes, just like the SPAD pixels 21 and 22, the SPAD element 31, the quenching resistance 32, and the inverter 33.

Further, in the sensor-side wiring layer 42, the contact electrodes 71 to 73, a metal wiring 74B, the metal wirings 76, the contact electrodes 78 and 79, and the metal pads 80 to 82 are formed.

The configuration of the logic-side wiring layer 43 is similar to that of the SPAD pixel 22.

Figure 7:
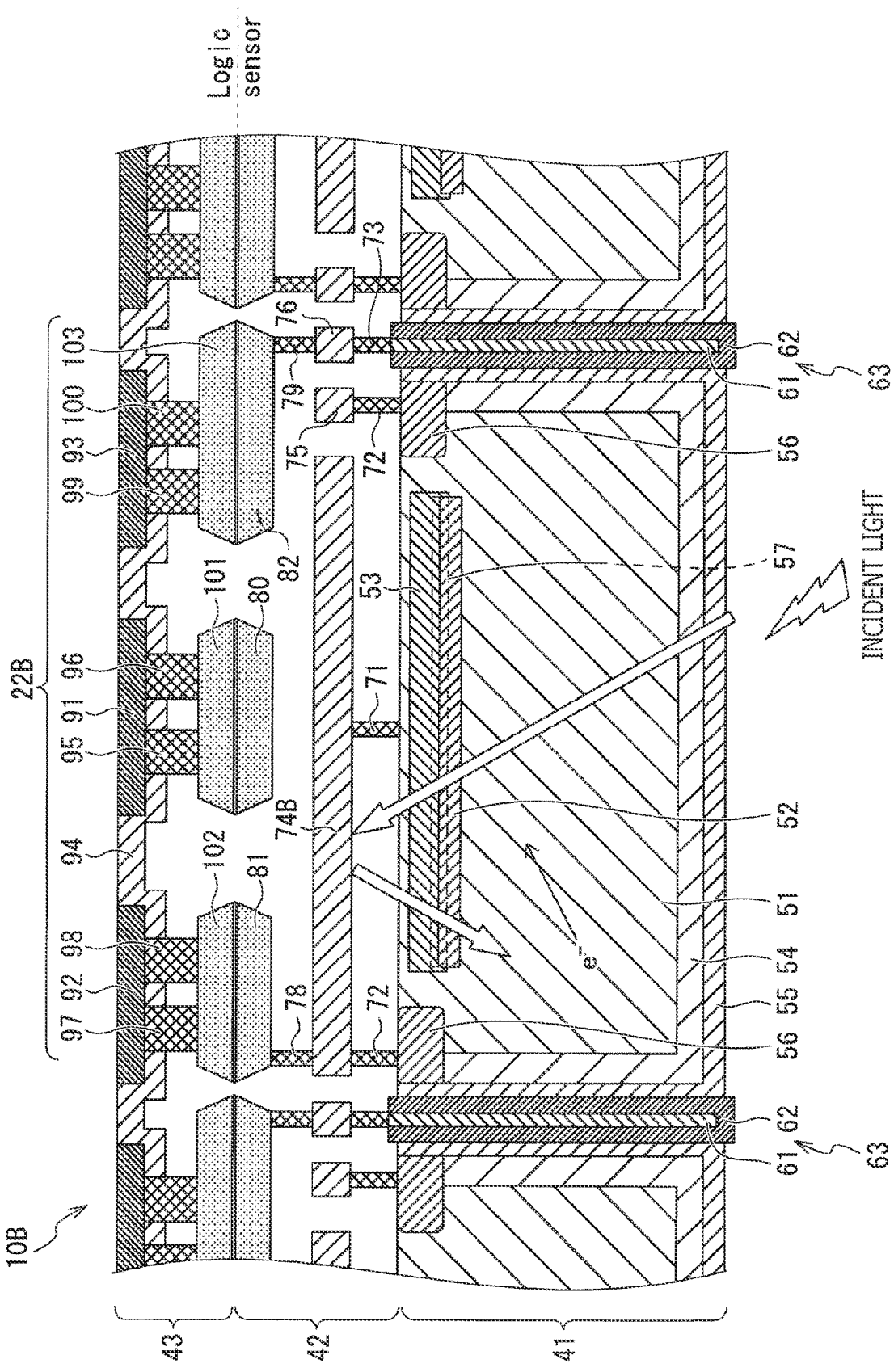
FIG. 7 is a cross-sectional view of a SPAD pixel of the sensor chip according to the third embodiment of the present disclosure illustrating a configuration example of the SPAD pixel.

As illustrated in FIG. 7, in the SPAD pixel 22B, in order to cause the cathode electric potential and the anode electric potential of the SPAD element 31 to be the same electric potential, the contact electrodes 71 and 72 are coupled to one metal wiring 74B. With this configuration, the cathode and the anode of the SPAD element 31 are short-circuited. Further, in the SPAD pixel 22B, any contact electrode for coupling the metal wiring 74B to the metal pad 80 is not provided, and thereby the SPAD element 31 is not electrically coupled to the quenching resistance 32 and the inverter 33.

Effects of Third Embodiment

The sensor chip 10B according to the second embodiment and having been configured in such a way as described above brings about effects similar to (1) to (4) in the first embodiment.

4. Fourth Embodiment

A sensor chip according the fourth embodiment will be described referring to FIGS. 2 to 4 and using FIGS. 8(A) to 8(C).

A sensor chip 10C according to the fourth embodiment is different from the sensor chip 10 according to the first embodiment in that the sensor chip 10C includes, as the reference pixels, SPAD pixels 21C instead of the SPAD pixels 21, and includes, as the dummy pixels, SPAD pixels 22C instead of the SPAD pixels 22.

(Circuit Configuration of Dummy Pixel)

In the following, a difference between the entire configuration of the SPAD pixels 21C and the SPAD pixels 22C and the entire configuration of the SPAD pixels 21 and the SPAD pixels 22 will be described.

The individual configurations of the SPAD pixel 21C and the SPAD pixel 22C are similar to those of the SPAD pixel 21 and the SPAD pixel 22B. Further, as illustrated in FIG. 8(B), the wirings for the SPAD element 31, the quenching resistance 32, and the inverter 33 in the SPAD pixel 22C are also similar to those in the SPAD pixel 22B.

Figure 8:
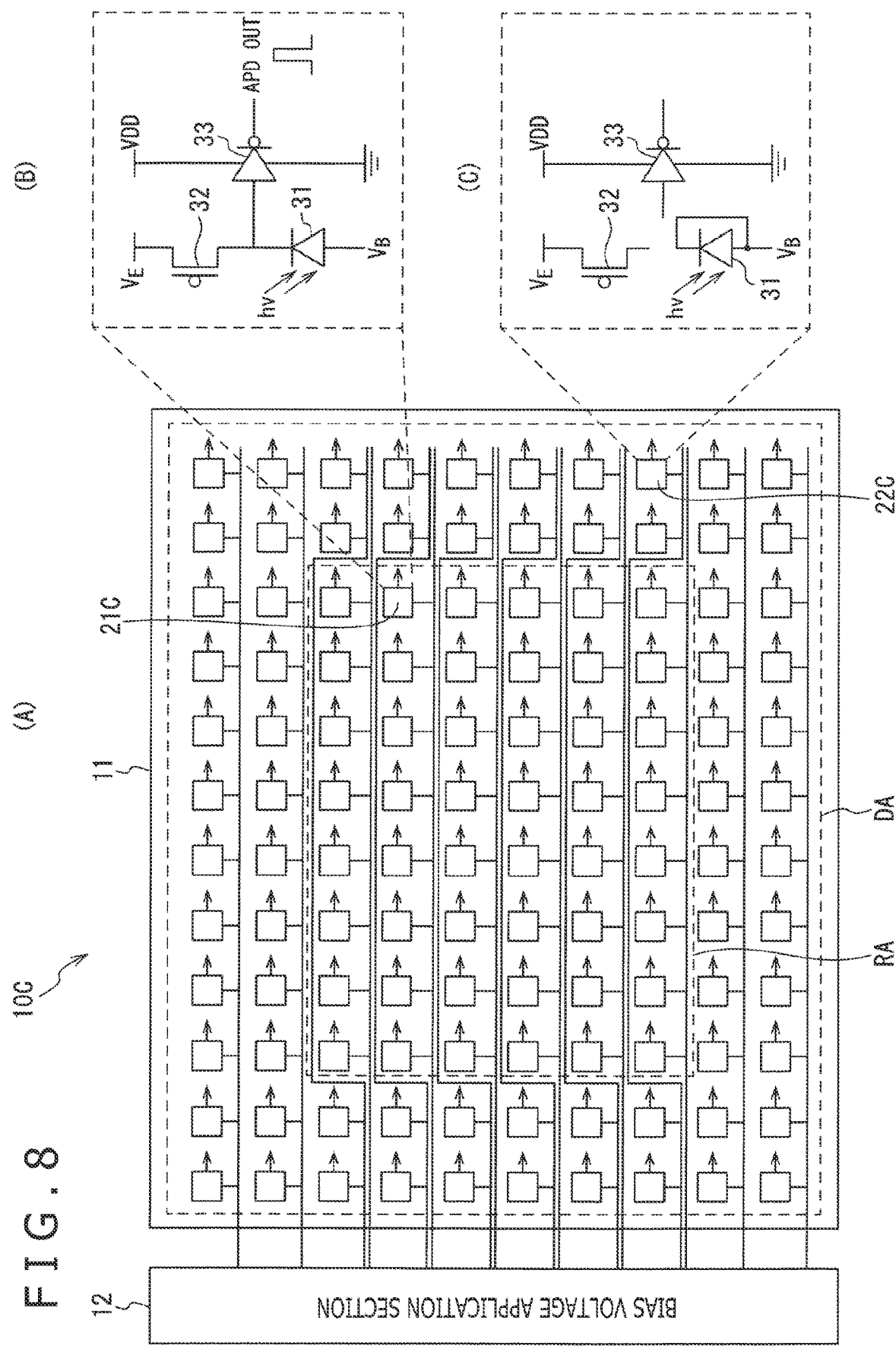
FIG. 8 is a block diagram illustrating a configuration example of a sensor chip according to a fourth embodiment of the present disclosure.

As illustrated in FIG. 8(A), the anodes of SPAD pixels 21C arranged in each row among the plurality of SPAD pixels 21C arranged in rows and columns are coupled to one another by a corresponding common wiring, and the anodes of SPAD pixels 22C arranged in each row among the plurality of SPAD pixels 22C arranged in the rows and columns are coupled to one another by a corresponding common wiring. That is, the sensor chip 10C is different from the sensor chip 10 according to the first embodiment in that the anodes of the plurality of SPAD pixels 21C and the anodes of the plurality of SPAD pixels 22C are separated from each other.

Effects of Fourth Embodiment

The sensor chip 10C according to the fourth embodiment and having been configured in such a way as described above brings about the following effect in addition to (1) to (4) in the first embodiment.

(5) In the sensor chip 10C, the anodes of the SPAD pixels 21C and the anodes of the SPAD pixels 22C are separated from each other. For this reason, even in a case where large electric currents have flown in the SPAD pixels 22C of the dummy pixel area DA, the large electric currents do not influence the SPAD pixels 22C of the reference pixel area. This configuration, therefore, makes it possible to prevent the drops of the anode electric potentials of the SPAD pixels 21C and thus prevent the degradation of sensing accuracy and the like of the sensor chip 10C.

5. Fifth Embodiment

A sensor chip according to the fifth embodiment will be described referring to FIGS. 2 to 4 and using FIGS. 9 and 10. A sensor chip 10D according to the fifth embodiment is different from the sensor chip 10 according to the first embodiment in that the sensor chip 10D includes a SPAD pixel 22D in which the anode and the cathode of the SPAD element 31 are short-circuited in the logic-side wiring layer 43. Further, the SPAD pixel 21 which is the reference pixel is formed in a way similar to that for the SPAD pixel 21 of the sensor chip 10 according to the first embodiment.

(Circuit Configuration of Dummy Pixel)

In the following, differences between the SPAD pixel 22D and the SPAD pixel 21 will be described.

Figure 9:
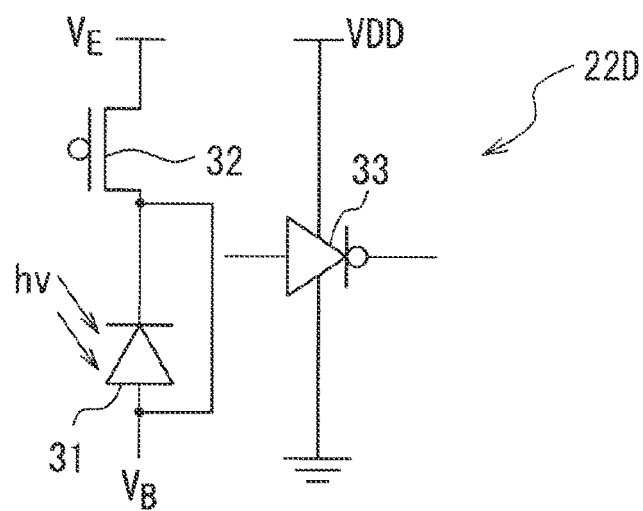
FIG. 9 is a circuit diagram illustrating a configuration example of a sensor chip according to a fifth embodiment of the present disclosure.

As illustrated in FIG. 9, the anode of the SPAD element 31 of the SPAD pixel 22D which is the dummy pixel is coupled to the bias voltage application section 12. Further, the cathode of the SPAD element 31 is coupled to the source terminal of the quenching resistance 32, but is not coupled to the inverter 33. Moreover, the cathode and the anode of the SPAD element 31 are short-circuited in the logic-side wiring layer 43. That is, the cathode electric potential and the anode electric potential of each of the SPAD elements 31 that are formed in the dummy pixel area DA included in the pixel area A1 and located near the peripheral edge of the pixel area A1 are caused to be the same electric potential. Thus, the SPAD element 31 is not supplied, to its cathode, with the large negative voltage, and is in a substantially non-functional state.

(Configuration of Dummy Pixel)

A configuration example of the SPAD pixel 22D which is the dummy pixel of the sensor chip 10D will be described using FIG. 10. FIG. 10 is a cross-sectional view of the SPAD pixel 22D illustrating a configuration example of the SPAD pixel 22D.

The SPAD pixel 22D includes, just like the SPAD pixels 21 and 22, the SPAD element 31, the quenching resistance 32, and the inverter 33.

The configuration of the sensor-side wiring layer 42 is similar to that of the SPAD pixel 22 of the first embodiment.

In the logic-side wiring layer 43, an electrode pad 91D, the electrode pad 93, the insulating layer 94, the contact electrodes 95 to 100, and the metal pads 101 to 103 are formed.

Figure 10:
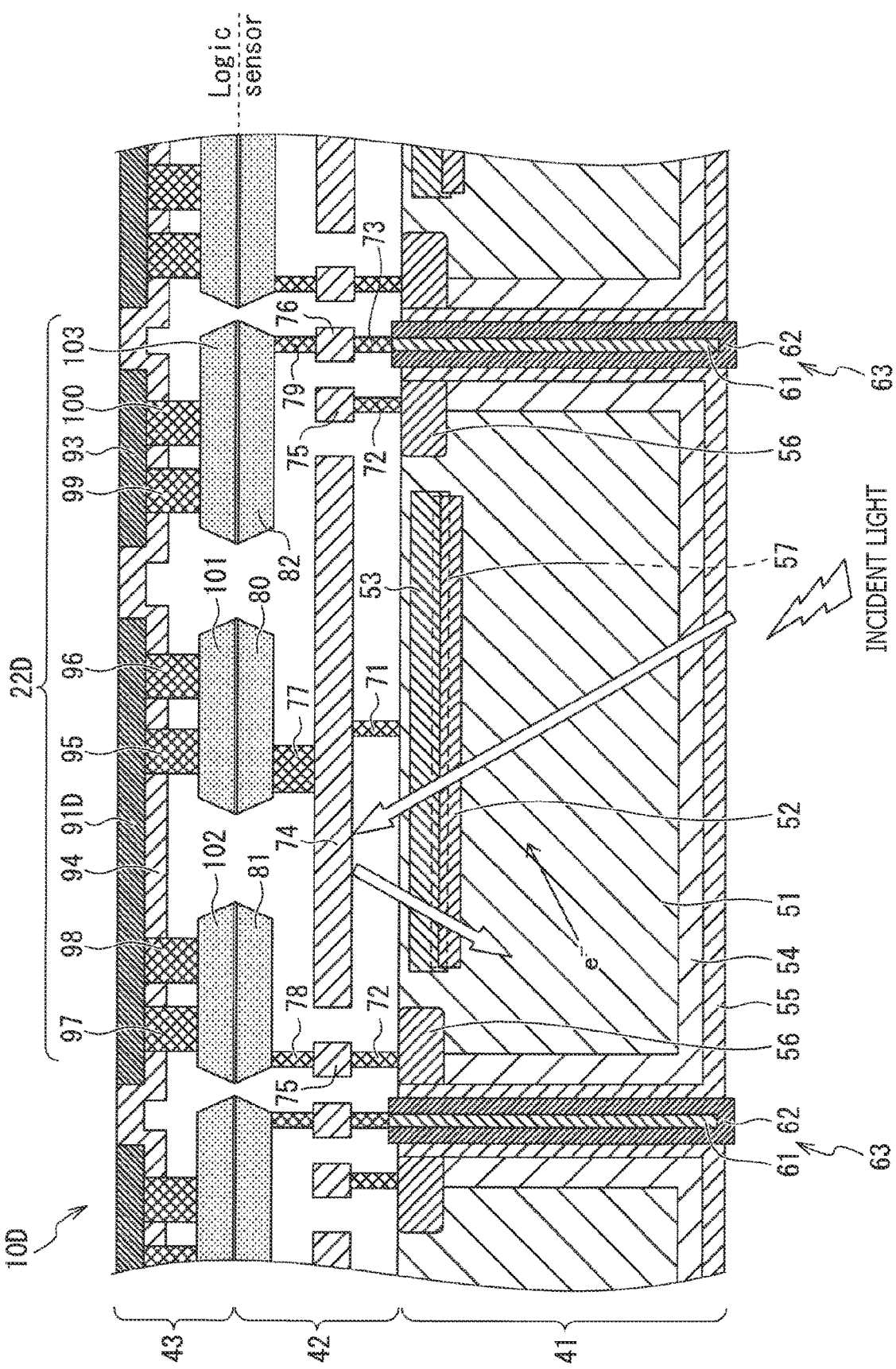
FIG. 10 is a cross-sectional view of a SPAD pixel of the sensor chip according to the fifth embodiment of the present disclosure illustrating a configuration example of the SPAD pixel.

As illustrated in FIG. 10, in the SPAD pixel 22D, in order to cause the cathode electric potential and the anode electric potential of the SPAD element 31 to be the same electric potential, the contact electrodes 95 to 98 are coupled to one electrode pad 91D. With this configuration, the cathode and the anode of the SPAD element 31 are short-circuited in the logic-side wiring layer 43. Further, in the logic-side wiring layer 43, wirings for the SPAD pixel 22D are formed such that the SPAD element 31 and the quenching resistance 32 are not coupled to the inverter 33.

Effects of Fifth Embodiment

The sensor chip 10D according to the fifth embodiment and having been configured in such a way as described above brings about effects similar to (1) to (4) in the first embodiment.

6. Sixth Embodiment

A sensor chip according to the sixth embodiment will be described referring to FIGS. 2 to 4 and using FIGS. 11 and 12. A sensor chip 10E according to the sixth embodiment is different from the sensor chip 10 according to the first embodiment in that the sensor chip 10E includes, as the dummy pixels, SPAD pixels 22E instead of the SPAD pixels 22. Further, the SPAD pixels 21, which are the reference pixels, are formed in a way similar to that for the SPAD pixels 21 of the sensor chip 10 according to the first embodiment.

(Circuit Configuration of Dummy Pixel)

In the following, differences between such a SPAD pixel 22E and the SPAD pixel 21 will be described.

Figure 11:
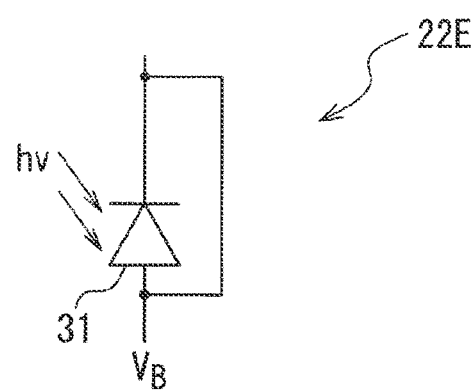
FIG. 11 is a circuit diagram illustrating a configuration example of a sensor chip according to a sixth embodiment of the present disclosure.
Figure 12:
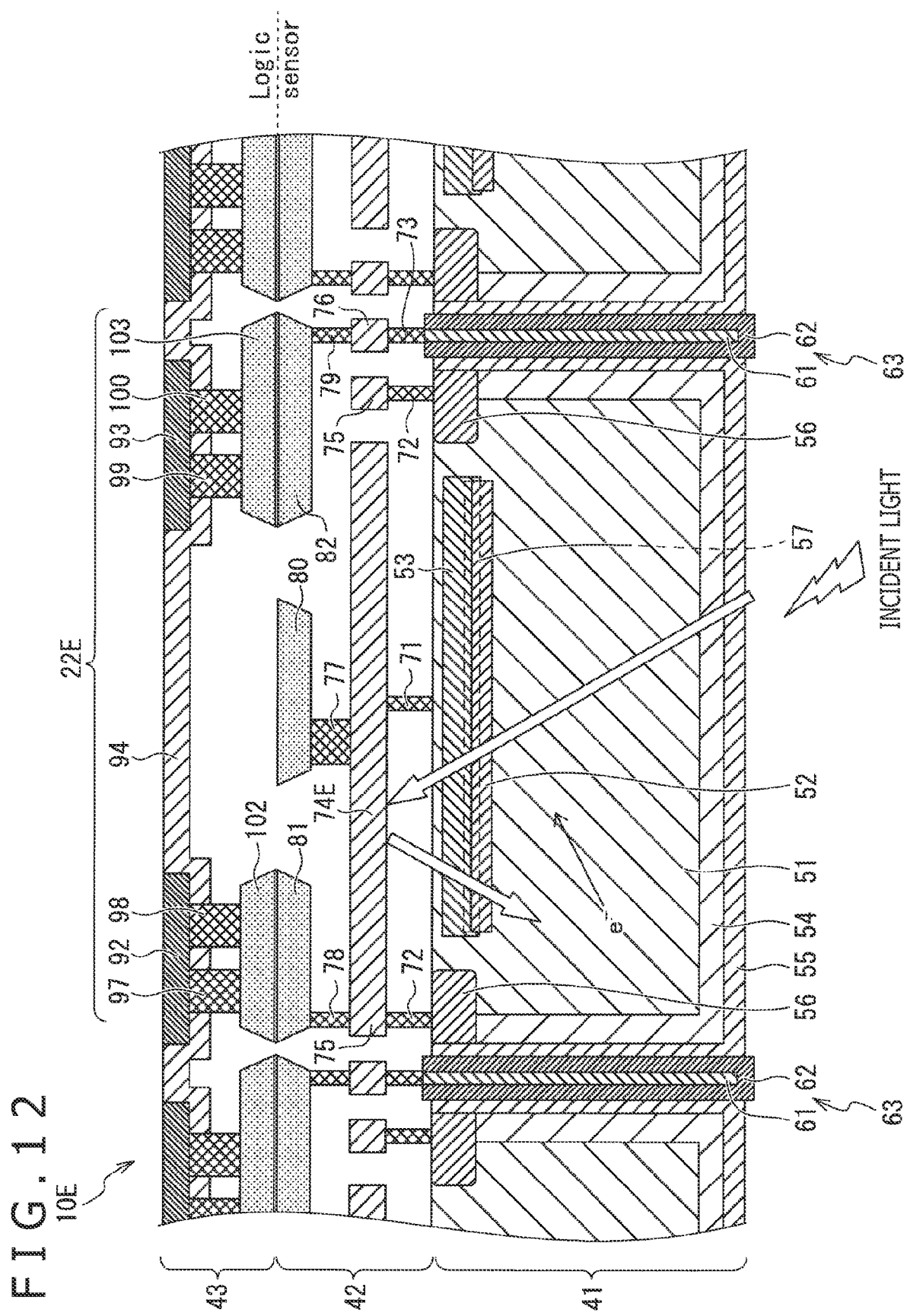
FIG. 12 is a cross-sectional view of a SPAD pixel of the sensor chip according to the sixth embodiment of the present disclosure illustrating a configuration example of the SPAD pixel.

As illustrated in FIG. 11, the SPAD pixel 22E which is the dummy pixel is different from the SPAD pixel 21 in that the SPAD pixel 22E includes the SPAD element 31, but does not include the quenching resistance 32 and the inverter 33.

Further, in the sensor-side wiring layer 42, the contact electrodes 71 to 73, the metal wirings 74B and 76, the contact electrodes 78 and 79, and the metal pads 80 to 82 are formed.

The configuration of the logic-side wiring layer 43 is similar to that of the SPAD pixel 22.

For the SPAD element 31, its anode is in a state of being coupled to the bias voltage application section 12, and its cathode is in a state of being not coupled to the source terminal of the quenching resistance 32 but coupled to the anode. That is, the cathode electric potential and the anode electric potential of each of the SPAD elements 31 that are formed in the dummy pixel area DA included in the pixel area A1 and located near the peripheral edge of the pixel area A1 are caused to be the same electric potential. Thus, the SPAD element 31 is not supplied, to its cathode, with the large negative voltage, and is in a substantially non-functional state.

Further, in the logic-side wiring layer 43, although the inverter 33 is not provided, the anode electric potential and the cathode electric potential of the SPAD element 31 are caused to be the same electric potential by short-circuiting the anode and the cathode of the SPAD element 31. This configuration causes no electric current to flow through each of the SPAD pixels 22E and thereby prevents the degradation of the characteristics of the sensor chip 10E with further certainty.

Here, the anode and the cathode of the SPAD element 31 may be each caused to be in a floating state.

(Configuration of Dummy Pixel)

A configuration example of the SPAD pixel 22E which is the dummy pixel of the sensor chip 10E will be described using FIG. 12. FIG. 12 is a cross-sectional view of the SPAD pixel 22E illustrating a configuration example of the SPAD pixel 22E.

In the SPAD pixel 22E, as described above, the SPAD element 31 is formed in the sensor substrate 41.

Further, in the sensor-side wiring layer 42, the contact electrodes 71 to 73, the metal wiring 74E and 76, the contact electrodes 78 and 79, and the metal pads 80 to 82 are formed.

In the logic-side wiring layer 43, the electrode pads 92 and 93, the insulating layer 94, the contact electrodes 97 to 100, and the metal pads 102 and 103 are formed.

As illustrated in FIG. 7, in the SPAD pixel 22E, in order to cause the cathode electric potential and the anode electric potential of the SPAD element 31 to be the same electric potential, the contact electrodes 71 and 72 are coupled to one metal wiring 74B. Further, in the SPAD pixel 22E, any wiring included in the logic-side wiring layer 43 and electrically coupled to the cathode of the SPAD element 31 is not provided.

Effects of Sixth Embodiment

The sensor chip 10E according to the fifth embodiment and having been configured in such a way as described above brings about effects similar to (1) to (4) in the first embodiment.

7. Configuration Example of Electronic Device

Figure 13:
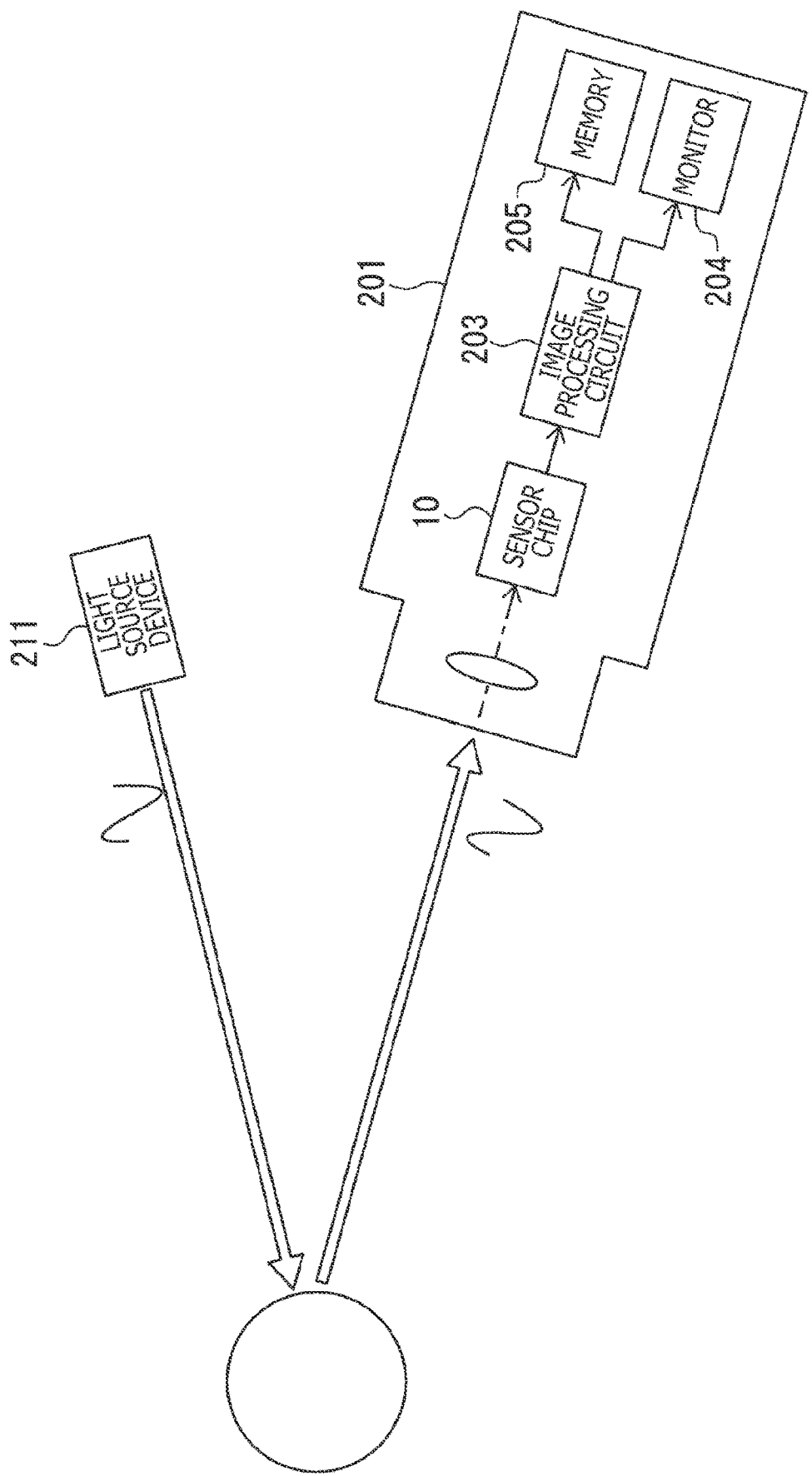
FIG. 13 is a block diagram illustrating a configuration example of a distance image sensor that is an electronic device utilizing a sensor chip according to the present disclosure.

FIG. 13 is a block diagram illustrating a configuration example of a distance image sensor that is an electronic device utilizing the sensor chip 10.

As illustrated in FIG. 13, a distance image sensor 201 includes an optical system 202, the sensor chip 10, an image processing circuit 203, a monitor 204, and a memory 205. The distance image sensor 201 is capable of acquiring a distance image according to distances up to an object by receiving light (modulated light or pulse light) resulting from the reflection of light having been emitted toward the object by a light source device 211 at the surface of the object.

The optical system 202 includes one or more lenses, and guides image light (incident light) from each of the object to the sensor chip 10 to cause an image to be formed on a light receiving surface (a sensor section) of the sensor chip 10.

As the sensor chip 10, one of the sensor chips 10 according to the individual embodiments described above is applied, and distance signals indicating distances acquired from the received light signals (APD OUT) output from the sensor chip 10 are supplied to the image processing circuit 203.

The image processing circuit 203 performs image processing for building up a distance image on the basis of the distance signals having been supplied from the sensor chip 10, and the distance image (image data) having been acquired through the image processing is supplied to and displayed on the monitor 204 or is supplied to and stored (recorded) in the memory 205.

In the distance image sensor 201 configured in such a way as described above, applying one of the above-described sensor chips 10 allows distances up to an object to be calculated on the basis of only the received light signals from the highly stable SPAD pixels 21, and this enables generation of a highly accurate distance image. That is, the distance image sensor 201 is capable of acquiring a further exact distance image.

8. Usage Examples of Image Sensor

The above-described image sensor can be used, as described below, in various cases in which, for example, visible light, infrared light, ultraviolet light, X-ray light, and the like are sensed.

- Devices for imaging images used for viewing, such as a digital camera and a mobile device with a camera function.
- Devices used for traffic, such as an in-vehicle sensor for, for the purpose of safe driving such as an automatic stop, and recognition of a driver's condition, imaging the front, rear, surroundings, inside, and the like of an automobile, a monitoring camera for monitoring traveling vehicles and roads, a distance measurement sensor for measuring inter-vehicle distances, and the like.
- Devices used in home appliances, such as a television set, a refrigerator, and an air conditioner, for imaging user's gestures and causing operations onto equipment according to the gestures to be performed.
- Devices used for medical treatment and healthcare, such as an endoscope and a device for performing angiography by receiving infrared light.
- Devices used for security, such as a monitoring camera for crime prevention application and a camera for person authentication application.
- Devices used for cosmetology, such as skin measurement equipment for imaging skin, and a microscope for imaging scalp.
- Devices used for sports, such as an action camera and a wearable camera that are for sport application, and the like.
- Devices used for agriculture, such as a camera for monitoring states of fields and crops.

It should be noted that the present technology may have the following configurations.

(1)
A sensor chip including:
a pixel array section including a pixel area in which a plurality of pixels is arranged in rows and columns;
an avalanche photodiode element that amplifies a carrier by a high electric field area provided for the each of the pixels;
an inter-pixel separation section that insulates and separates the each of the pixels from another pixel adjacent to the each of the pixels in a semiconductor substrate in which the avalanche photodiode element is formed; and
a wiring that is arranged in a wiring layer laminated on a surface being opposite to a light receiving surface of the semiconductor substrate in such a way as to cover at least the high electric field area,
in which the pixel array section includes a dummy pixel area located near a peripheral edge of the pixel area, and
a cathode electric potential and an anode electric potential of the avalanche photodiode element that is arranged in the dummy pixel area are a same electric potential, or at least one of the cathode electric potential and the anode electric potential is in a floating state.

(2)
The sensor chip according to (1), in which a cathode and an anode of the avalanche photodiode element arranged in the dummy pixel area are short-circuited.

(3)
The sensor chip according to (1) or (2), further including:
a sensor substrate in which the avalanche photodiode element is formed;
a logic circuit substrate in which the quenching resistance and the inverter are formed; and
a wiring layer that includes a sensor-side wiring layer arranged opposite the sensor substrate and a logic-side wiring layer arranged opposite the logic circuit substrate and that electrically couples the sensor substrate and the logic circuit substrate to each other,
in which the cathode and the anode of the avalanche photodiode element arranged in the dummy pixel area are short-circuited in the logic-side wiring layer.

(4)
The sensor chip according to any one of (1) to (3),
in which the pixel array section includes a reference pixel area located at a center of the pixel area,
anodes of a plurality of the avalanche photodiode elements arranged in the reference pixel area is coupled to one another by a common wiring,
anodes of a plurality of the avalanche photodiode elements arranged in the dummy pixel area is coupled to one another by a common wiring, and
the anodes of the plurality of avalanche photodiode elements arranged in the reference pixel area and the anodes of the plurality of avalanche photodiode elements arranged in the dummy pixel area are separated from each other.

(5)
The sensor chip according to any one of (1) to (4),
in which each of pixels arranged in the reference pixel area includes
the avalanche photodiode element,
a quenching resistance coupled to the avalanche photodiode element in series, and
an inverter that outputs a received light signal on the basis of electrons having been multiplied in the avalanche photodiode element, and
each of pixels arranged in the reference pixel area includes the avalanche photodiode element and does not include the quenching resistance that is coupled to the avalanche photodiode element in series, and the inverter that outputs the received light signal on a basis of the electrons having been multiplied in the avalanche photodiode element.

(6)
An electronic device including:
a sensor chip including
a pixel array section including a pixel area in which a plurality of pixels is arranged in rows and columns,
an avalanche photodiode element that amplifies a carrier by a high electric field area provided for the each of the pixels, an inter-pixel separation section that insulates and separates the each of the pixels from another pixel adjacent to the each of the pixels in a semiconductor substrate in which the avalanche photodiode element is formed, and a wiring that is arranged in a wiring layer laminated on a surface being opposite to a light receiving surface of the semiconductor substrate in such a way as to cover at least the high electric field area, in which the pixel array section includes a dummy pixel area located near a peripheral edge of the pixel area, and a cathode electric potential and an anode electric potential of the avalanche photodiode element that is arranged in the dummy pixel area are a same electric potential, or at least one of the cathode electric potential and the anode electric potential is in a floating state.

The scope of the present disclosure is not limited to the embodiments having been illustrated and described as examples so far, and also includes all embodiments that bring about effects equal to effects intended by the present disclosure. Moreover, the scope of the present disclosure is not limited to combinations of the features of inventions defined by claims of the present description, and can be defined by every desired combination of particular features among all of the individual features having been disclosed.

REFERENCE SIGNS LIST 10, 10A, 10B, 10C, 10D, 10E: Senor chip
11: Pixel array section
12: Bias voltage application section
21, 21C, 22, 22A, 22B, 22C, 22D, 22E: SPAD pixel
23: Electrode pad
31: SPAD element
32: Quenching resistance
33: Inverter
41: Sensor substrate
42: Sensor-side wiring layer
43: Logic-side wiring layer
51: N-well
52: P-type diffusion layer
53: N-type diffusion layer
54: Hole accumulation layer
55: Pinning layer
56: High-concentration P-type diffusion layer
57: Avalanche multiplying area
61: Metal film
62: Insulating film
63: Inter-pixel separation section
71, 72, 73: Contact electrode
74, 74B, 74E, 75, 76: Metal wiring
77, 78, 79: Contact electrode
80, 81, 82, 101, 102, 103: Metal pad
91, 91D, 92, 93: Electrode pad
94: Insulating layer
95, 96, 97, 98, 99, 100: Contact electrode
A1: Pixel area
A2: Peripheral area
A3: Pad area
DA: Dummy pixel area
RA: Reference pixel area

What is claimed is:

1. A sensor chip, comprising:
   a pixel array section, wherein the pixel array section includes a pixel area in which a plurality of pixels is arranged in rows and columns,
   wherein each pixel in the plurality of pixels includes an avalanche photodiode element,
   wherein the pixel area includes a dummy pixel area and a reference pixel area,
   wherein the dummy pixel area includes a plurality of dummy pixels, and
   wherein, for each dummy pixel in the plurality of dummy pixels, at least one of a cathode electric potential of the avalanche photodiode element and an anode electric potential of the avalanche photodiode element is in a floating state.

2. The sensor chip according to claim 1, wherein the dummy pixel area is located near a peripheral edge of the pixel area.

3. The sensor chip according to claim 1, wherein the dummy pixel area surrounds the reference pixel area.

4. The sensor chip according to claim 1, wherein the reference pixel area includes a plurality of reference pixels.

5. The sensor chip according to claim 4, wherein, for each dummy pixel in the plurality of dummy pixels, a cathode and an anode of the avalanche photodiode element are short-circuited.

6. The sensor chip according to claim 1, wherein, for each reference pixel in the plurality of reference pixels, the avalanche photodiode element amplifies a carrier.

7. The sensor chip according to claim 1, wherein, for each pixel in the plurality of pixels, the avalanche photodiode includes an avalanche multiplying area.

8. The sensor chip according to claim 7, further comprising:
   for each pixel in the plurality of pixels, a wiring that is included in a sensor-side wiring layer and that is more widely formed than the avalanche multiplying area of the avalanche photodiode element.

9. The sensor chip according to claim 8, wherein the wiring is metal.

10. The sensor chip according to claim 9, wherein the wiring covers the avalanche multiplying area.

11. The sensor chip according to claim 10, wherein the wiring is reflective.

12. The sensor chip according to claim 1, wherein anodes of the avalanche photodiode elements of the reference pixels are coupled to one another by a common wiring.

13. The sensor chip according to claim 12, wherein anodes of the avalanche photodiode elements of the dummy pixels are coupled to one another by a common wiring.

14. The sensor chip according to claim 13, wherein the anodes of the reference pixels and the anodes of the dummy pixels are separated from each other.

15. The sensor chip according to claim 1,
   wherein each of the reference pixels includes:
      a quenching resistance coupled to the avalanche photodiode element; and
      an inverter that outputs a received light signal on a basis of electrons having been multiplied in the avalanche photodiode element, and
   wherein a quenching resistance is not coupled to the avalanche photodiode element of any of the dummy pixels.

16. The sensor chip according to claim 1, further comprising:

an inter-pixel separation section, wherein, for each pixel in the plurality of pixels, the inter-pixel separation section insulates and separates the pixel from another pixel adjacent to the pixel in a semiconductor substrate in which the avalanche photodiode is formed.

17. The sensor chip according to claim 16, wherein the inter-pixel separation section is embedded in the semiconductor substrate.

18. The sensor chip according to claim 17, wherein the inter-pixel separation section includes a metal film covered by an insulating film.

19. The sensor chip according to claim 16, wherein the inter-pixel separation section is reflective.

20. An electronic device, comprising:
   an optical system;
   a pixel array section, wherein the pixel array section includes a pixel area in which a plurality of pixels is arranged in rows and columns,
   wherein each pixel in the plurality of pixels includes an avalanche photodiode element,
   wherein the pixel array section includes a dummy pixel area and a reference pixel area,
   wherein the dummy pixel area includes a plurality of dummy pixels, and
   wherein, for each dummy pixel in the plurality of dummy pixels, at least one of a cathode electric potential of the avalanche photodiode element and an anode electric potential of the avalanche photodiode element is in a floating state; and
   an image processing circuit, wherein the optical system guides image light to the pixel array section, and wherein the image processing circuit performs image processing for building up a distance image.

* * * * *